(12) United States Patent
Popek et al.

(10) Patent No.: US 12,306,268 B2
(45) Date of Patent: May 20, 2025

(54) HEALTH MONITORING IN ELECTRIC MOTOR CONTROL SYSTEMS

(71) Applicant: Hamilton Sundstrand Corporation, Charlotte, NC (US)

(72) Inventors: Grzegorz Popek, Birmingham (GB); Stephen Minshull, Bromsgrove (GB)

(73) Assignee: Hamilton Sundstrand Corporation, Charlotte, NC (US)

( * ) Notice: Subject to any disclaimer, the term of this patent is extended or adjusted under 35 U.S.C. 154(b) by 264 days.

(21) Appl. No.: 17/863,233

(22) Filed: Jul. 12, 2022

(65) Prior Publication Data

US 2023/0028926 A1    Jan. 26, 2023

(30) Foreign Application Priority Data

Jul. 13, 2021    (EP) .................................... 21275094

(51) Int. Cl.
| | |
|---|---|
| *H02H 3/04* | (2006.01) |
| *G01R 31/52* | (2020.01) |
| *H02H 7/08* | (2006.01) |
| *H02P 23/14* | (2006.01) |
| *H02P 27/06* | (2006.01) |
| *H03H 7/01* | (2006.01) |

(52) U.S. Cl.
CPC .............. *G01R 31/52* (2020.01); *H02P 23/14* (2013.01); *H02P 27/06* (2013.01); *H03H 7/01* (2013.01)

(58) Field of Classification Search
CPC ........... H02P 23/14; H02P 27/06; H03H 7/01; G01R 31/52

USPC ......................................................... 318/490
See application file for complete search history.

(56) References Cited

U.S. PATENT DOCUMENTS

| | | | |
|---|---|---|---|
| 6,593,751 B2 | 7/2003 | Takahashi | |
| 7,064,516 B2 | 6/2006 | Yamada et al. | |
| 9,255,970 B2 | 2/2016 | Neti et al. | |
| 2001/0048310 A1 | 12/2001 | Takahashi | |
| 2008/0080106 A1* | 4/2008 | Mirafzal | H02M 1/12 |
| | | | 361/42 |
| 2008/0150549 A1 | 6/2008 | Horikoshi et al. | |
| 2010/0013402 A1* | 1/2010 | Chaffai | H05B 45/18 |
| | | | 315/291 |
| 2014/0084937 A1 | 3/2014 | Neti et al. | |

OTHER PUBLICATIONS

Extended European Search Report for European Patent Application No. EP21275094.7, dated Jan. 7, 2022.

(Continued)

*Primary Examiner* — Erick D Glass (57) ABSTRACT

The present invention relates to a system and method for the monitoring and detection of insulation degradation in electric systems. The system comprises a controller for an electric motor (3), including input circuitry (2a) for connecting the controller to a power supply (1), power conversion circuitry (2b) for providing a power output for the electric motor (3), and sensing circuitry (2c) for monitoring a current inside the controller that is representative of a return leakage current from the electric motor to the motor controller. A condition of the insulation may be determined based on the monitored current.

20 Claims, 5 Drawing Sheets

(56) References Cited

OTHER PUBLICATIONS

Shede Pallavi, et al., "Leakage current sensing techniques", 2017 Third International Conference on Sensing, Signal Processing and Security (ICSSS), IEEE, May 4, 2017, pp. 181-185, XP033228455, DOI: 10.1109/SSPS.2017.8071588 [retrieved on Oct. 18, 2017].
Younsini, K, et al., "On-line Capacitance and Dissipation Factor Monitoring of AC Stator Insulation", IEEE 2010.

* cited by examiner

HEALTH MONITORING IN ELECTRIC MOTOR CONTROL SYSTEMS

CROSS REFERENCE TO RELATED APPLICATIONS

This application claims priority to and the benefit of European Patent Application No. 21275094.7, filed Jul. 13, 2021, the entire content of which is incorporated herein by reference.

TECHNICAL FIELD

The technology described herein relates to the monitoring and detection of insulation degradation in electric systems, particularly in electric motor systems suitable for use in aircraft.

BACKGROUND

A common cause of insulation failure is the ageing of the insulation material. Therefore, a desire for insulation monitoring emerges. This desire is especially prevalent for systems operating at higher voltage levels, such as propulsion class motor systems suitable for aircraft, and systems that utilise fast switches such as wide band gap devices, where the insulation failure can have critical consequences.

The degradation of the insulating material may result in characteristic changes to the leakage current from an electric system. It is therefore known that the degradation and/or failure of the insulating material can be detected by monitoring the leakage current for these characteristic changes. For example, this is described in the reference "On-line Capacitance and Dissipation Factor Monitoring of AC Stator Insulation", K. Younsini et. Al, IEEE 2010. Another example is presented in US 2014/0084937 (BAKER HUGHES).

Existing insulation monitoring methods typically rely on sensors plugged directly into stator feeder cables to measure an output Common Mode (CM) current in feeding cables, or to measure a leakage current to the ground by checking the leakage current on each phase of the system or by e.g. measuring a current in a ground conductor. Such methods generally require the incorporation of a number of additional components into the electric system, making them difficult to retrofit into existing systems. In addition, these additional components can make such existing methods less suitable for certain applications, such as those with a limited amount of space or for which a higher weight has significant disadvantages, such as for electric systems on-board an aircraft.

For instance, in aircraft, there is currently a trend towards so-called More Electric Aircraft (MEA) whereby loads such as flight control surfaces, landing gear, actuators, fans, pumps etc. which have traditionally been controlled by hydraulic and mechanical systems are now being designed to be controlled electrically by means of an electric motor. As such, the impact of any increase in the weight of the electric systems of an aircraft may be multiplied across a large number of such systems. Moreover, attempting to monitor the current in the ground conductor of an aircraft in order to monitor motor insulation can be difficult in practice, not least since the ground conductor may carry current from other such equipment on-board the aircraft. Furthermore, the grounding infrastructure in an aircraft is often some distance away from the electric motor system of interest, and therefore is often not very accessible for measurements (and may require placing sensors close to the aircraft body, where the measurements would then be subject to extreme environmental conditions such as lightning strikes, vibrations and humidity).

The Applicants have therefore recognised that there is a need for improvements in the use and design of systems for monitoring the health of insulation materials.

SUMMARY

The technology disclosed herein provides a method for monitoring a condition of motor insulation within an electric motor system comprising a power supply, a controller for an electric motor, and the electric motor element itself. The electric motor controller is thus connected to the power supply and arranged to provide a suitable motor load (or motor loads) to the electric motor.

The electric motor controller according to the present disclosure thus comprises input circuitry for connecting the controller to a power supply and power conversion circuitry for providing a power output for the electric motor. The input circuitry comprises an electromagnetic interference (EMI) filter for isolating the power conversion circuitry from electromagnetic interference from the power supply (and also for containing other noise that originates in the power conversion circuitry within the motor controller). The power conversion circuitry thus takes the (filtered) input current, and then converts this appropriately to the desired output level to provide the motor load. The electric motor controller according to the present disclosure further comprises sensing circuitry for monitoring a current inside the controller that is representative of a return leakage current from the electric motor to the motor controller.

The method according to the present disclosure thus comprises monitoring, using the sensing circuitry, a current that is representative of a return leakage current from the motor, and then determining, based on the monitored current, a condition of the motor insulation. The method is in embodiments an "online" monitoring method, i.e. such that the condition of the motor insulation can be monitored over time during use of the motor.

In the above arrangements, sensing circuitry is thus provided for monitoring a current within the motor controller that is operable to monitor a current within the electric motor controller which current is at least representative of a return leakage current flowing from the electric motor back into the controller. In other words, the sensing circuitry is in effect operable to measure a common mode leakage current returning from the "ground" to the electric motor controller which return leakage current thus represents (only) a part of the total leakage current of the motor. This can advantageously be done without adding any specific sensing circuitry to the grounding network or a ground conductor within the overall system within which the motor system is provided. Thus, the overall electric motor system may further comprise a ground conductor that carries currents to ground, and in embodiments there is no (additional) sensing circuitry on the ground conductor itself.

In this respect, the Applicants have recognised that the leakage current through the motor insulation system will typically form a closed loop through the chassis in which the motor and motor controller is mounted. The leakage current will thus generally first travel through the motor insulation to the chassis, and then return through the chassis to the motor controller, as this will typically provide a low impedance path in the system, at least for the return leakage current from the respective motor that is being controlled by the motor controller. This approach works well in particular due to the presence of the EMI filter in the controller frontend that reduces and separates the impact of other leakage currents within the overall system such that the dominant leakage current that will be measured by the sensing circuitry in the motor controller will be the return leakage current through the insulation of the respective motor to which the motor controller is connected. It will be appreciated that the motor and the motor controller may be mounted within the same chassis (motor housing) or may be mounted separately. In either case, the arrangement is such that there is a return leakage current path that extends through the motor insulation and chassis (singular or plural) into the motor controller.

The Applicants thus further recognise that the returning leakage current can advantageously be monitored using sensing circuitry inside of, and associated with, the motor controller itself (e.g. rather than using an additional sensor that is directly connected to the motor insulation and/or to a ground wire cable), and the monitored current within the motor controller can then be used appropriately to determine prognostic/diagnostic information regarding the condition of the motor insulation. This means that the technology described herein can utilise existing circuitry within the motor controller to monitor the return leakage current, and thereby monitor the condition of the motor insulation. This can therefore advantageously reduce the size and/or number of components required for monitoring the health of the motor insulation, thereby helping reduce the weight of the system.

After determining the returning leakage current, the determined returning leakage current can in turn be processed to determine a status or condition of the motor insulation. For instance, there may be a known or predetermined relationship between the return leakage current and the condition of the insulation. This relationship may, e.g., be determined by suitable off-line testing, or simulation, as desired. The processing of the monitored current can be performed in any suitable manner. For example, the status of the insulation may be determined using a threshold leakage current, e.g., such that when the monitored current exceeds the threshold leakage current, it is determined that the motor insulation should be replaced, and a suitable output (alert) can be generated accordingly. This threshold may be an absolute value, or may be e.g. relative to an initially measured leakage current value. Or, in another example, the leakage current may be monitored for a characteristic spike that indicates a sudden deterioration in the condition of the insulation or a characteristic rate of change of the leakage current. Thus, in general, the monitoring may comprise monitoring a trend change in the monitored current over time, with the trend change representing a change in the amount of return leakage current (and in turn a change in the condition of the insulation). Various other arrangements would be possible.

The technology described herein therefore provides a reliable online motor insulation monitoring method with results that are substantially independent of the other aircraft subsystems, along with a simpler insulation monitoring arrangement with a lighter weight due to a reduced number of components.

The current that is indicative of the return leakage current may be monitored at various suitable locations within the motor controller, as desired.

In some embodiments, the current is monitored at the frontend EMI filter of the input circuitry, i.e. where the motor controller is connected to an external power supply, and upstream of the power conversion circuitry in the motor controller. For instance, a low impedance return path is typically formed by, or comprises, the input EMI filter. The return leakage current will therefore normally flow through the EMI filter, such that this represents a particularly suitable position for monitoring the return leakage current, with the benefit that the sensing circuitry can be integrated with the existing components of the EMI filter.

The EMI filter of the input circuitry may be, for example, a single-phase or a two-phase EMI filter. The EMI filter is in embodiments a passive EMI filter. In embodiments, and beneficially, the EMI filter comprises a common mode choke. By providing such EMI filter at the motor controller input, this means that the motor controller is isolated from other sources of common mode noise (such as from the external power supply), which means that the return leakage current returning to the motor controller through the chassis that is monitored by the sensing circuit will be dominated by the return leakage current through the respective motor insulation.

Thus, it is also contemplated that the return leakage current may be monitored at other positions within the controller, e.g. at the power conversion circuitry, and in particular in a common mode DC link path within the power conversion circuitry, as will be explained further below. In embodiments, the sensing circuitry may advantageously be provided at any suitable location within the motor controller that is at or downstream of the EMI filter in the input circuitry such that the EMI filter isolates the sensing circuitry from sources of current other than due to the return leakage current flowing through the degraded motor insulation.

The returning leakage current can be measured by the sensing circuitry in a number of different ways. In some examples, the method comprises (directly) monitoring the return leakage current between the chassis and the controller, e.g., by monitoring a voltage drop across a resistor, such as a shunt resistor, that is connected between the chassis and a part of the controller. For example, the shunt resistor may be provided between the chassis and the EMI filter.

While this method beneficially provides a direct measurement of the returning leakage current, and may therefore provide a particularly simple and reliable method for monitoring the leakage current (and hence also the motor insulation condition), it may not always be possible to incorporate an additional shunt resistor between the controller and the chassis due to spatial limitations in some systems.

Similarly, a shunt resistor could also be provided between the chassis and the power conversion circuitry.

For instance, the power conversion circuitry may comprise a first stage for converting an alternating current to a direct current and a second stage for converting a direct current to an alternating current. That is, the power conversion circuitry may comprise an AC-to-AC converter. A common mode DC link capacitor may be provided between the first stage and the second stage. The first stage may be a component such as a rectifier while the second stage may be a component such as an inverter. Optionally, the power conversion circuitry may further comprise capacitors operable to reference the DC link capacitor to the chassis and thereby reduce the common mode currents visible at the input terminals of the DC link capacitor. This may therefore represent another suitable location for monitoring the return leakage current.

Thus, a shunt resistor may be connected between a chassis of the electric motor system and the input circuitry (e.g. the EMI filter), or between a chassis of the electric motor system and the power conversion circuitry. In either case, the measured voltage drop provides an indication of the returning leakage current.

The sensing circuitry may also comprise a resistor and/or a capacitor connected in series with the shunt resistor. A resistor with a greater resistance than the shunt resistor can assist in limiting the unbalance current which may flow due to imbalances in three phase AC supplies. Similarly, the capacitor may provide an additional common mode filter stage without eliminating the common mode current signature In another example, rather than using a shunt resistor to directly measure the voltage drop due to the return leakage current (or in some cases in addition to that), the sensing circuitry may comprise a sensor for magnetic fields that is operable to measure a (change in a) flux through the motor controller cables and/or conductors resulting from the return leakage current. The sensing circuitry may thus measure a flux through the input circuitry and/or the power conversion circuitry, and this may in some cases be more space-efficient. The flux detected by the sensor is a measurement of the magnetic field produced by the returning common mode current. Therefore, unlike the voltage drop across the shunt resistor, the flux caused by the current through the controller does not provide a direct measurement of the returning leakage current as the magnetic field results from a change in size of the common mode current. This method therefore provides a measurement of the rate of change of the common mode current. In some cases, only some of the measured flux will result from the leakage current with the rest being provided by changes to the current from the power supply. In some instances, the system may take time averaged measurements of the flux to reduce the influence of variations in output from the power supply. The winding coil or magnetic material can be used as a flux concentrator for the measurement purposes.

Thus, in embodiments, the sensing circuitry comprises an inductive coil. This may be provided at any suitable location within the motor controller, as desired.

For instance, this may comprise an additional (coil) winding within an inductive element of the motor controller. For example, an additional (coil) winding may be provide on a choke of the EMI filter. This then allows the returning leakage current to be determined by measuring a variation in the flux in the core of the second, as these variations are (at least in part) caused by the returning leakage current. Beneficially, this method does not require large amounts of additional space, and therefore is particularly suited for use in spatially limited systems. This may be particularly suited for use with a two-phase EMI filter, as the additional (coil) winding can easily be added to the second choke.

Or, this may comprise a separate wire coil provided within the motor controller, e.g. at a suitable position after the EMI filter. For instance, the wire coil may be wrapped about the input phases of the input circuitry or the DC link capacitor terminals of the power conversion circuitry. The coil may be, for example, a Rogowski coil. Similarly to the additional winding, this method allows the returning leakage current to be determined by measuring a variation in the flux through the controller as these variations will result from (at least in part) changes to the returning leakage current. However, unlike the additional winding method, this does not require a specific form of EMI filter, and this may therefore be the most flexible approach.

Various other arrangements and combinations of these arrangements would be possible.

The technology described herein also extends to an overall electric motor system comprising a power source, an electric motor, and a motor controller of the type described above. In embodiments, the electric motor system is for use on-board an aircraft. Thus, the technology described herein also extends to an aircraft including an electric motor system as described herein. However, whilst the technology described herein may be particularly suited for use in such applications, it will be appreciated that it may be used for any suitable applications where it is desired to monitor the health of motor insulation in an electric motor system.

An indication of the current monitored by the sensing circuit may then be provided to a processing device for processing as part of the online health monitoring method. The computing device may form part of the controller and/or sensing circuit, or may otherwise be external to the controller, in which case data indicative of the monitored current may be transmitted to the external computing device. In either case, the processing device is operable to determine the returning leakage current based on the data received from the sensing circuit, and to determine a condition of the motor insulation based on the returning leakage current.

Various embodiments will now be described, by way of example only, with reference to the drawings.

BRIEF DESCRIPTION

Like reference numerals are used for like components where appropriate in the Figures.

DETAILED DESCRIPTION

Figure 1:
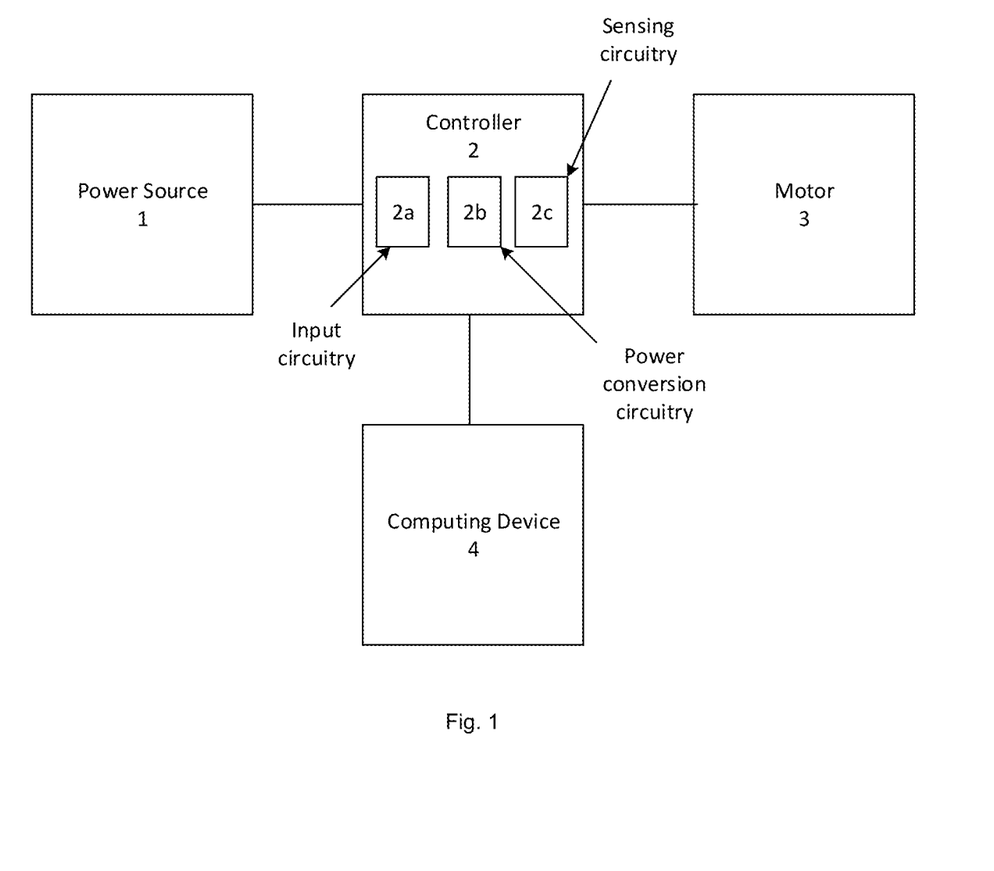
FIG. 1 is a schematic of an electric motor system.

FIG. 1 is a schematic diagram showing an electric motor system. The system comprises a power source 1, an electric motor 3 and a motor controller 2 for the electric motor 3. The power source 1 is typically an AC power supply. The controller comprises input circuitry 2a for connecting the controller 2 to the power supply and a power conversion circuitry 2b for providing a power output to the electric motor 3.

At least the motor 3 sits within a chassis or motor housing (not shown), and is insulated from the chassis and wider aircraft structure by insulation such as the motor winding insulation. However, as the condition of the insulation deteriorates (for example, due to age), the leakage current travelling through the insulation of the motor winding to the chassis is expected to change, for example to increase.

The Applicants have realised that at least a part of the leakage current will form a closed loop by travelling from the motor 3 to the controller 2 (via the chassis), and then returning to the motor 3 from the controller 2. For example, in system for an aircraft, the leakage current may flow in a closed loop from the controller 2 to the electric motor 3 via feeder cables. The displacement current may then enter an aircraft grounding or a feeder cable shield and return to the controller 2, via e.g. an EMI filter.

The controller 2 therefore further comprises sensing circuitry 2c, operable to monitor a current representative of this returning leakage current. The electric motor system further comprises a computing device 4 to determine the returning leakage current from the monitored current, and thereby determine a status of the motor insulation. The computing device 4 can be an external device that receives data from the sensing circuitry, or may otherwise be incorporated into the controller 2 and/or the sensing circuitry 2c. Optionally, the controller 2 and/or computing device 4 may include a memory device (not shown) for storing past values and/or features of the leakage current for further analysis, such as long term drift analysis.

Figure 2:
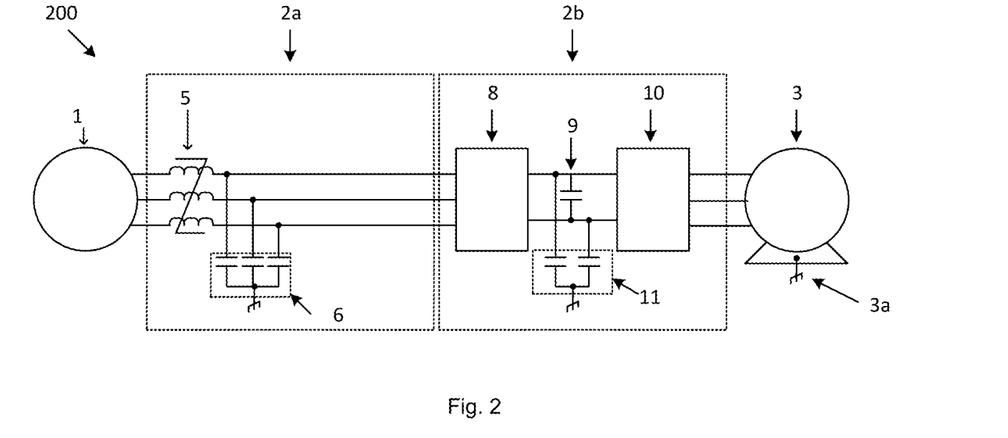
FIG. 2 is an example of an electric motor system with a single-stage EMI filter.

FIG. 2 shows an example of a typical electric motor system 200, such as an electric motor system suitable for use on an aircraft. The system 200 comprises a power source 1, an electric motor 3 and a motor controller 2a,b. The controller includes input circuitry 2a and power conversion circuitry 2b. As previously discussed, as the condition of the insulation of the motor 3 deteriorates, an increasing leakage current may start to travel through the insulation of the motor winding of the motor 3 to the chassis, as shown by connection 3a. Connection 3a can be provided by various sources. For example, the connection 3a may be e.g. a direct electrical connection between the motor and the chassis, or alternatively may represent a current induced in the chassis by the motor 3.

The input circuitry 2a comprises an EMI filter for reducing reduce electronic noise that may cause interference with other devices. The EMI filter includes a choke 5 and differential capacitors 6. The choke 5 is connected to the input of the input circuitry 2a and separates the motor controller from unwanted frequencies, such as high frequencies, from external components such as the power source 1. The effect of this is therefore that any common mode current measured by the sensing circuitry 2c will be dominated by the current leaking through the insulation and returning the motor controller through the chassis, such that by including appropriate sensing circuitry 2c within the motor controller it is possible to reliably monitor such return leakage current, and in turn to monitor the condition of the motor insulation. Further, this can be done in a relatively simple manner, by including such sensing circuitry 2c within the motor controller, as described further below, without having to attempt to monitor the current directly in the grounding network of the system.

The power conversion circuitry 2b can comprise an input stage 8, such as a rectifier, for converting an alternating current to a direct current, and an output stage 10, such as an inverter, for converting the direct current to an alternating current. Thus, the power conversion circuitry 2b may generally comprise an AC-to-AC converter.

The power conversion circuitry may also further comprise a DC link capacitor 9, which assists in improving the stability of the DC voltage, acts as a local energy storage and facilitates short communication loops for the safe operation of the input stage 8 an/or the output stage 10. Optionally, the power conversion circuitry 2b may further comprise additional capacitors 11, which are operable to reference the DC link capacitor 9 to the chassis and thereby reduce the common mode currents visible at the input terminals of the DC link capacitor 9.

Figure 3:
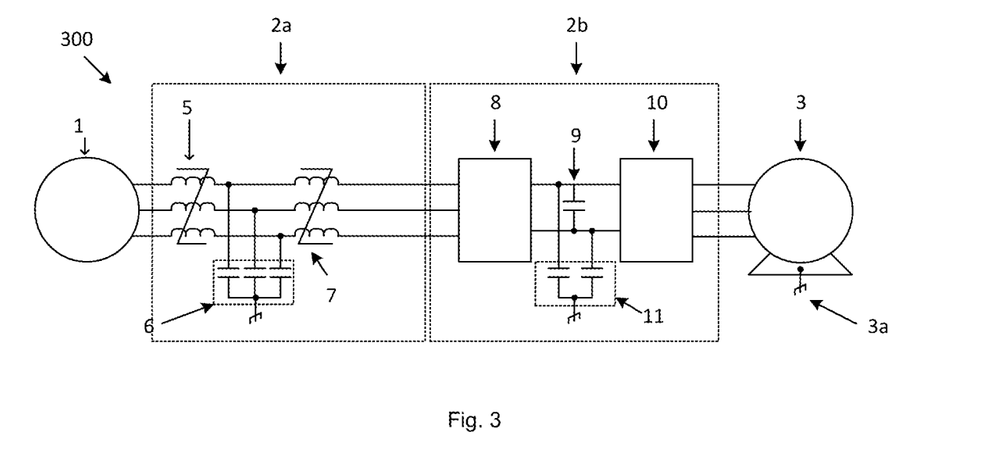
FIG. 3 is an example of an electric motor system with a two-stage EMI filter.

FIG. 3 shows a further example of an electric motor system 300. FIG. 3 is largely identical to FIG. 2. However, the input circuitry 2a of electric motor system 300 includes a two-stage EMI filter. The two-stage EMI filter comprises a first choke 5 and a second choke 7. The first choke 5 is connected in the same manner as choke 5 of FIG. 1, while second choke 7 is connected between the differential mode capacitors 6 and power conversion circuitry 2b.

Figure 4A:
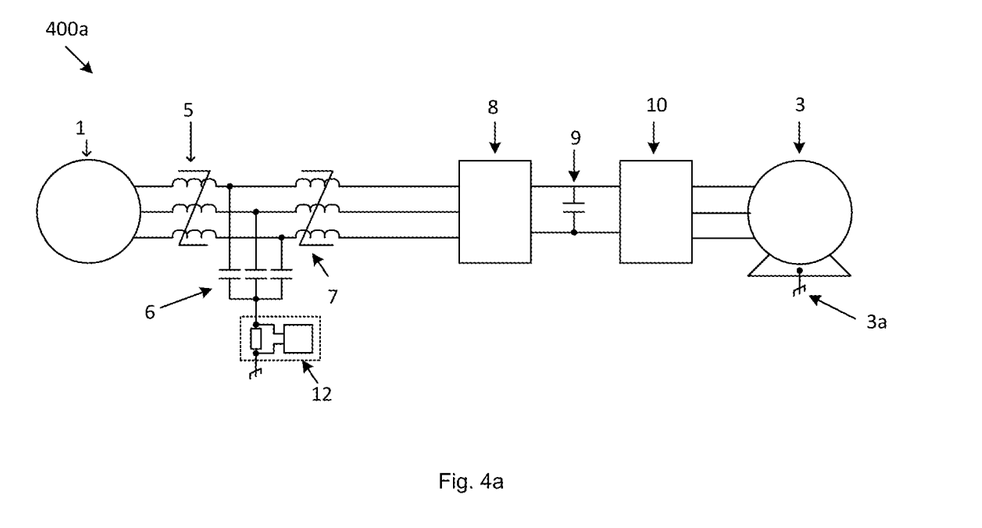
FIGS. 4a and b are example systems for monitoring degradation of the insulation using a resistor according to an embodiment.

FIG. 4a shows a system 400a suitable for monitoring deterioration of the motor insulation according to an embodiment. The system 400a comprises sensing circuitry consisting of a shunt resistor 12 connected between the input circuitry and the chassis of the system 400a.

Specifically, the shunt resistor 12 is connected between the differential mode capacitors 6 and the chassis. By measuring the voltage drop across the shunt resistor 12, the leakage current flowing from the chassis to the input circuitry can be determined accordingly.

Figure 4B:
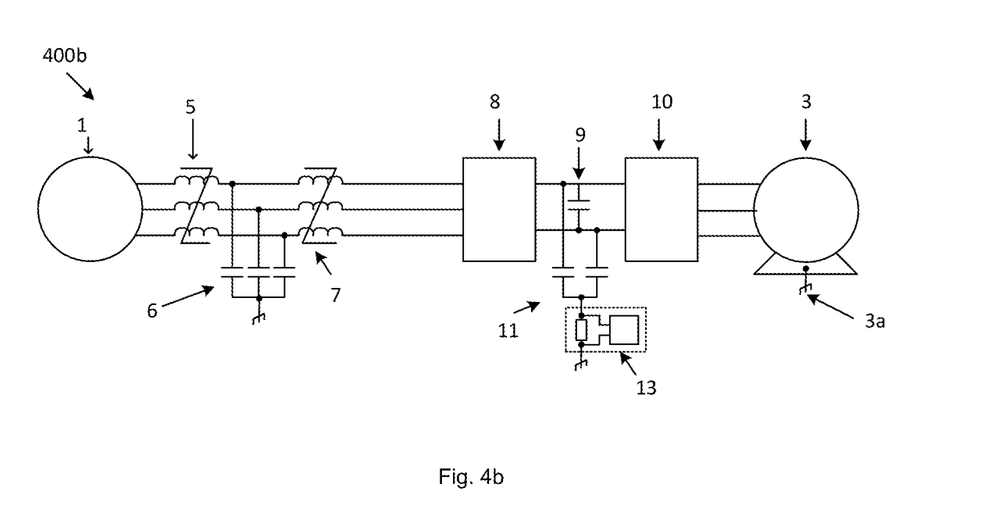

FIG. 4b shows a system 400b which is similar to system 400a, but comprises sensing circuitry between the chassis and the power conversion circuitry. The sensing circuitry again comprises a shunt resistor 13, which is connected between capacitors 11 and the chassis. Shunt resistor 13 provides the same function as shunt resistor 12, in that the voltage drop across it can be measured to provide an indication of the returning leakage current.

In both systems 400a and 400b the leakage current forms a closed loop, flowing from the motor 3 into the chassis at connection 3a, before returning to the motor 3 via the controller. However, in system 400a the leakage current flows into the controller via the EMI filter of the input circuitry, while in system 400b the leakage current is split between the EMI filter (via capacitors 6) and the power conversion circuitry (via capacitors 11). As a result, analysis of the leakage current in FIG. 4b may primarily focus on features of the leakage current (such as the rate of change of the current or a threshold increase relative to an initial measurement) rather than an absolute measurement when determining a state of the insulation.

Alternatively, it will be understood that the sensing circuitry may comprise a means for the providing an indication of the returning leakage current at both the EMI filter (i.e. via capacitors 6) and the power conversion circuitry (i.e. via capacitors 11). For example, the system may comprise both shunt resistor 12 and shunt resistor 13.

It will be further understood that system 400a, and all other systems disclosed herein (including systems 500, 600 and 700) may optionally comprise the additional capacitors 11, and that the analysis methods discussed in relation to FIG. 4b may also be used to determine the state of the insulation based on the measurements of the leakage current returning via capacitors 6.

In each of systems 400a and 400b, the sensing circuitry may further comprise a resistor and/or a capacitor (not shown) connected in series with shunt resistors 12 or 13. A resistor with a greater resistance than shunt resistor 12, 13 can assist in limiting the unbalance current which may flow due to imbalances in three phase AC supplies. Similarly, the capacitor may provide an additional common mode filter stage without eliminating the common mode current signature As the shunt resistors 12 and 13 provide similar methods for monitoring the returning leakage current, they can be incorporated into motor controllers as desired based on the available space in the system.

While systems 400a and 400b are shown with two-phase EMI filters, it will be understood that shunt resistors 12 and 13 may instead be implemented in systems comprising a single phase EMI filter.

Figure 5:
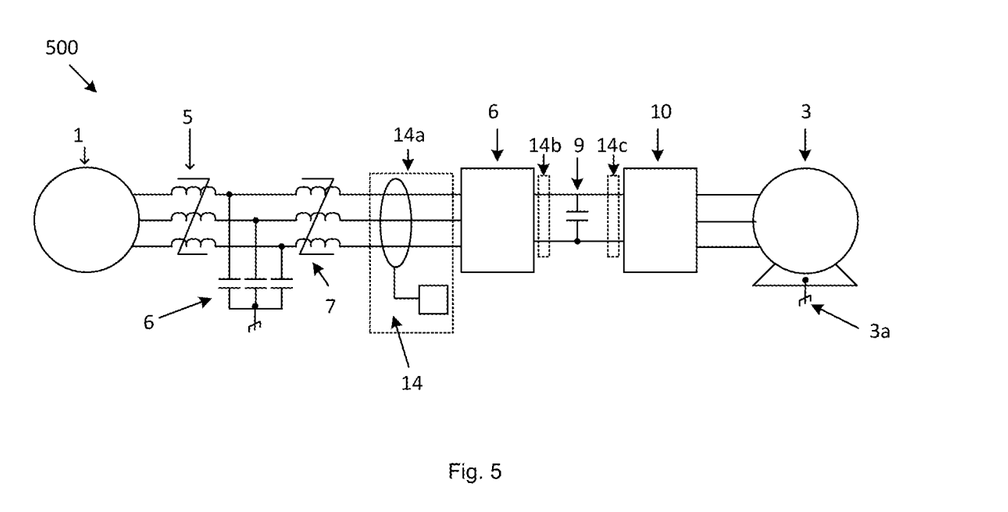
FIG. 5 is an example system for monitoring degradation of the insulation using a coil according to an embodiment.

FIG. 5 shows a system 500 according to a further embodiment. As in system 400a, in system 500 the leakage current flows from motor 3 into the chassis via contact 3a, and then forms a closed loop by flowing into the controller via the EMI filter of the input circuitry.

In system 500, the sensing circuitry of the controller comprises a flux concentrator 14, such as a wire coil (for example a Rogowski coil) or a magnetic flux concentrator. Optionally, a Rogowski coil may be provided without an integrator in order to assist in recording the magnetic flux as an instantaneous (di/dt) value. The flux concentrator 14 can detect a flux flowing through the controller power cables. The returning leakage current results in a magnetic flux, and as a result the flux total through the controller provides an indication of the magnitude and/or features of the returning leakage current (which may include, for example, the insulation displacement current). Flux concentrator 14 therefore provides a means for measuring the returning leakage current based on these variations.

The flux concentrator 14 may be positioned within the input circuitry (for example, wrapped around the input phases in position 14a as shown in FIG. 5), or may alternatively be positioned in the power conversion circuitry (for example, wrapped around the DC link capacitor terminals in positions 14b or 14c).

While system 500 is shown with a two-stage EMI filter, it will be understood that wire coil 10 may instead be implemented in a system comprising a single-stage EMI filter, such as system 300 of FIG. 3.

Figure 6:
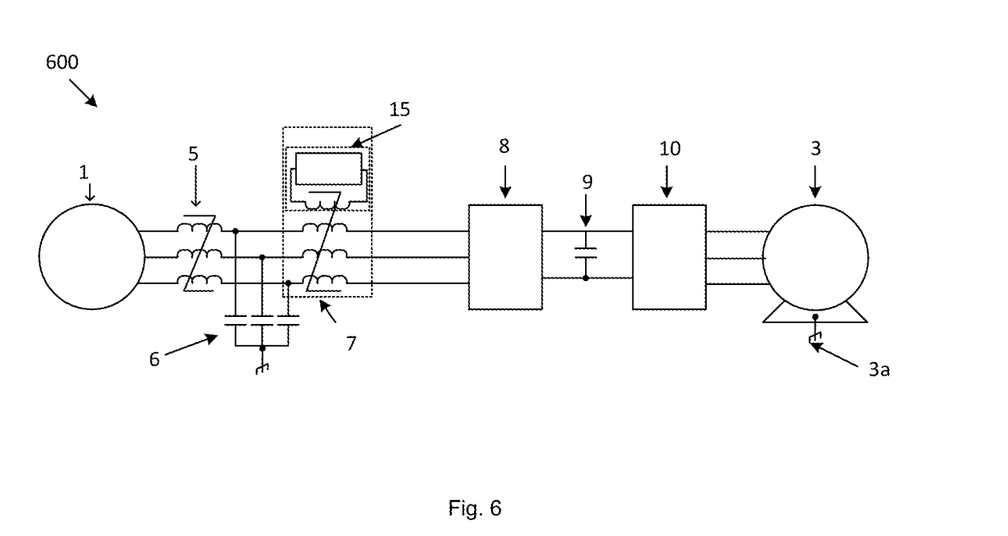
FIG. 6 is an example system for monitoring degradation of the insulation using an additional choke winding according to an embodiment.

FIG. 6 shows a system 600 according to a further embodiment. As in systems 400a and 500, in system 600 the leakage current flows from motor 3 into the chassis via contact 3a, and then forms a closed loop by flowing into the controller via the EMI filter of the input circuitry.

In system 600, the sensing circuitry of the controller comprises an additional winding 15 on the second choke 7. The returning leakage current results in a variation in the flux in the common mode core of the second choke 7. Therefore, similarly to the wire coil of system 500, the additional winding 15 provides a means for measuring the returning leakage current based on these variations in the measured flux.

Figure 7:
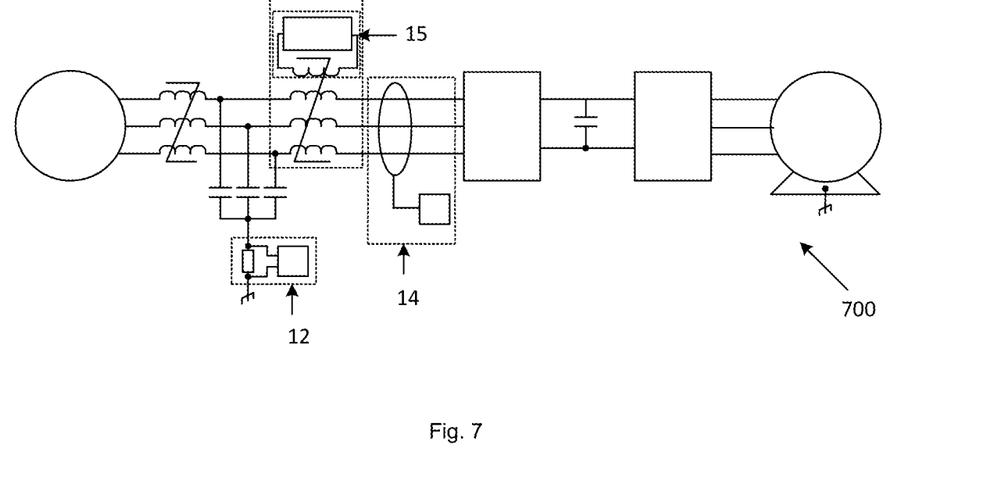
FIG. 7 is an example system for monitoring degradation of the insulation according to an embodiment.

It will be understood that the sensing circuitry of the controller is not limited merely to the above examples, and may instead comprise any combination of the above described components for monitoring the returning leakage current. Providing multiple means for monitoring the returning leakage current ensures that there is redundancy within the system and improves the reliability of the measurements. For example, FIG. 7 shows an example system 700 including a sensing circuitry that comprises each of shunt resistor 12, flux concentrator 14 and additional winding 15. Equally, it will be understood that any other combinations of the above described sensing circuits may be employed, for example utilising shunt resistor 13 in place of or in addition to the shunt resistor 12 shown in FIG. 7. Similarly, flux concentrator 14 may be provided at any one or more of the locations 14a, b and c shown in FIG. 5, and the system may optionally be provided with multiple flux concentrators at different locations and/or the same location. For example, the system may include a Rogowski coil at location 14a and a magnetic flux concentrator at location 14b, or vice versa.

Figure 8:
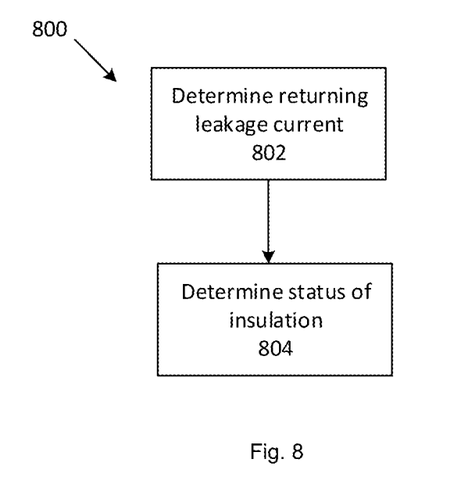
FIG. 8 is an example flow diagram for a method according to an embodiment.

FIG. 8 is a flow diagram 800 for showing an example method according to an embodiment. The method comprises determining a returning leakage current of the system in step 802, and then, based on this returning leakage current, determining a status of the motor insulation in step 804.

Step 802 may comprise monitoring a current indicative of the returning leakage current by any one or more of the methods described above, and then, based on the data provided by the sensing circuit, determining the returning leakage current. For example, if the sensing circuitry comprises a shunt resistor with a known resistance (as discussed in e.g. FIGS. 4a and 4b), the returning leakage current may be determined by measuring a voltage drop across the shunt resistor and applying Ohm's law to find the current through the shunt resistor.

In step 804, the status of the insulation can be determined using any suitable relationship between the leakage current and the insulation status, as desired. For example, the status of the insulation may be determined using a threshold leakage current and/or a threshold increase from an initial leakage current, or, in another example, by monitoring the leakage current for a characteristics such as a spike that indicates a sudden deterioration in the condition of the insulation or a characteristic rate of change of the leakage current.

Variations on the examples described above fall within the scope of the claims.

The invention claimed is:

1. A controller for an electric motor, the controller comprising:
   input circuitry configured to connect the controller to a power supply;
   power conversion circuitry configured to provide a power output for the electric motor, wherein the input circuitry comprises an electromagnetic interference filter configured to isolate the power conversion circuitry from electromagnetic interference from the power supply; and
   sensing circuitry configured to monitor a current inside the controller that is representative of a return leakage current from the electric motor to the controller;
   wherein the return leakage current from the electric motor to the controller includes at least one of:
      a leakage current flowing from the electric motor into a chassis of the electric motor via a connection before flowing to the input circuitry; or
      a leakage current flowing from the electric motor into the chassis of the electric motor via a connection before flowing to the power conversion circuitry.

2. The controller of claim 1, wherein the electromagnetic interference filter comprises a common mode choke.

3. The controller of claim 1, wherein the sensing circuitry is configured to monitor a voltage drop between the chassis and the electromagnetic interference filter.

4. The controller of claim 1, wherein the sensing circuitry is configured to monitor a voltage drop between the chassis and the power conversion circuitry.

5. The controller of claim 3, wherein the sensing circuitry comprises a shunt resistor connected between the chassis and the controller.

6. The controller of claim 1, wherein the sensing circuitry is configured to monitor a flux generated in the controller by the return leakage current.

7. The controller of claim 6, wherein:
the sensing circuitry comprises at least one of a wire coil or a flux concentrator; and
the at least one of the wire coil or the flux concentrator is provided downstream of the input circuitry of the controller.

8. The controller of claim 1, wherein the power conversion circuitry comprises:
a first stage configured to convert an alternating current to a direct current;
a second stage configured to convert a direct current to an alternating current for output; and
a capacitor arrangement between the first stage and the second stage.

9. The controller of claim 8, wherein a shunt resistor is connected between the chassis and the capacitor arrangement of the power conversion circuitry.

10. The controller of claim 1, further comprising a computing device configured to process the monitored current and generate an output indicative of a condition of insulation of the electric motor.

11. An electric motor system comprising:
a power supply;
an electric motor; and
a controller according to claim 1 connected between the power supply and the electric motor.

12. The electric motor system of claim 11, further comprising:
a computing device configured to process the monitored current and generate an output indicative of a condition of insulation of the electric motor;
wherein the sensing circuitry is configured to transmit a signal indicative of the monitored current to the computing device for processing.

13. A controller for an electric motor, the controller comprising:
input circuitry configured to connect the controller to a power supply;
power conversion circuitry configured to provide a power output for the electric motor, wherein the input circuitry comprises an electromagnetic interference filter configured to isolate the power conversion circuitry from electromagnetic interference from the power supply; and
sensing circuitry configured to monitor a current inside the controller that is representative of a return leakage current from the electric motor to the controller;
wherein the sensing circuitry comprises a coil winding within an inductive choke of the electromagnetic interference filter; and
wherein the sensing circuitry is configured to measure a flux through the input circuitry.

14. The controller of claim 13, wherein:
the electromagnetic interference filter comprises a first choke and second choke;
the first choke is connected in series between the second choke and the power supply;
the sensing circuitry comprises an additional winding on the second choke; and
the sensing circuitry is configured to measure a flux in a core of the second choke.

15. The controller of claim 13, wherein the return leakage current from the electric motor to the controller includes at least one of:

a leakage current flowing from the electric motor into a chassis of the electric motor via a connection before flowing to the input circuitry; or
a leakage current flowing from the electric motor into the chassis of the electric motor via a connection before flowing to the power conversion circuitry.

16. A method for monitoring a condition of insulation of an electric motor connected to a controller, the controller comprising (i) input circuitry configured to connect the controller to a power supply, (ii) power conversion circuitry configured to provide a power output for the electric motor, wherein the input circuitry comprises an electromagnetic interference filter for isolating the power conversion circuitry from electromagnetic interference from the power supply, and (iii) sensing circuitry configured to monitor a current inside the controller that is representative of a return leakage current from the electric motor to the controller, wherein the method comprises:
monitoring, using the sensing circuitry, the current that is representative of the return leakage current; and
determining, based on the monitored current, the condition of the insulation of the electric motor;
wherein the return leakage current from the electric motor to the controller includes at least one of:
a leakage current flowing from the electric motor into a chassis of the electric motor via a connection before flowing to the input circuitry; or
a leakage current flowing from the electric motor into the chassis of the electric motor via a connection before flowing to the power conversion circuitry.

17. The method of claim 16, further comprising at least one of:
monitoring a voltage drop between the chassis and the electromagnetic interference filter;
monitoring a voltage drop between the chassis and the power conversion circuitry; or
monitoring a flux generated in the controller by the return leakage current.

18. The method of claim 16, wherein:
the sensing circuitry comprises a coil winding within an inductive choke of the electromagnetic interference filter;
the electromagnetic interference filter comprises a first choke and second choke;
the first choke is connected in series between the second choke and the power supply;
the sensing circuitry comprises an additional winding on the second choke; and
the method comprises measuring a flux in a core of the second choke.

19. The method of claim 16, further comprising:
processing the monitored current; and
generating an output indicative of the condition of the insulation of the electric motor.

20. The method of claim 16, wherein;
the sensing circuitry comprises a coil winding within an inductive choke of the electromagnetic interference filter; and
the sensing circuitry is configured to measure a flux through the input circuitry.

* * * * *